(12) United States Patent
Shill

(10) Patent No.: US 7,088,274 B2
(45) Date of Patent: Aug. 8, 2006

(54) DIFFERENCE AMPLIFIER FOR DIGITAL-TO-ANALOG CONVERTER

(75) Inventor: Mark Allan Shill, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/119,913

(22) Filed: Apr. 9, 2002

(65) Prior Publication Data

US 2003/0189506 A1    Oct. 9, 2003

(51) Int. Cl.
    *H03M 1/66*     (2006.01)
(52) U.S. Cl. ...................................... 341/144; 341/155
(58) Field of Classification Search ................ 341/144, 341/122, 155, 118, 120, 154, 150; 330/255; 327/350, 334
See application file for complete search history.

(56) References Cited

U.S. PATENT DOCUMENTS

| | | | | |
|---|---|---|---|---|
| 3,585,633 A * | 6/1971 | Young | ........................ | 341/153 |
| 3,824,413 A * | 7/1974 | Awipi et al. | ..................... | 327/5 |
| 3,877,023 A * | 4/1975 | Spicer et al. | ................ | 341/118 |
| 3,995,227 A * | 11/1976 | Lefevre | ........................... | 330/9 |
| 4,338,592 A * | 7/1982 | Wilensky | ..................... | 341/118 |
| 4,363,024 A | 12/1982 | Brokaw | ........................ | 341/138 |
| 4,551,709 A * | 11/1985 | Merchant et al. | ........... | 341/118 |
| 4,651,110 A * | 3/1987 | Lechner et al. | .................. | 330/9 |
| 4,831,281 A * | 5/1989 | Miller | ........................ | 327/577 |
| 4,843,394 A | 6/1989 | Linz et al. | ................... | 341/154 |
| 4,857,860 A * | 8/1989 | Sevastopoulos | ............. | 330/107 |
| 4,888,589 A | 12/1989 | Bowers | ....................... | 341/153 |
| 4,990,916 A * | 2/1991 | Wynne et al. | ............... | 341/147 |
| 5,043,730 A * | 8/1991 | obinata | ........................ | 341/153 |
| 5,237,277 A * | 8/1993 | Lenz | ........................... | 324/322 |
| 5,237,526 A * | 8/1993 | Delagrange | ................. | 330/255 |
| 5,243,347 A * | 9/1993 | Jackson et al. | ............. | 341/144 |
| 5,283,579 A | 2/1994 | Tasdighi et al. | ............ | 341/145 |
| 5,283,580 A * | 2/1994 | Brooks et al. | .............. | 341/145 |
| 5,307,064 A | 4/1994 | Kudoh | ........................ | 341/144 |
| 5,523,712 A * | 6/1996 | Miyabe et al. | ............... | 327/350 |
| 5,585,795 A * | 12/1996 | Yuasa et al. | .................. | 341/118 |
| 5,701,101 A * | 12/1997 | Weinhardt et al. | .......... | 156/561 |
| 5,781,140 A | 7/1998 | Kao | ........................... | 341/154 |
| 6,060,912 A * | 5/2000 | Opris et al. | ................... | 327/57 |
| 6,104,120 A * | 8/2000 | Yamashita | ................... | 310/319 |
| 6,204,789 B1 * | 3/2001 | Nagata | ........................ | 341/144 |
| 6,310,567 B1 * | 10/2001 | Copley et al. | .............. | 327/334 |

OTHER PUBLICATIONS

Analog Devices, inc., pp. 1-6, AD557, 1992, no month.*

* cited by examiner

*Primary Examiner*—Peguy JeanPierre
(74) *Attorney, Agent, or Firm*—Carlton H. Hoel; W. James Brady; Frederick J. Telecky, Jr.

(57) ABSTRACT

An improved circuit is provided that buffers the output of a DAC while improving the bandwidth and linearity of the circuit. A DAC comprises an output signal of a switched DAC circuit coupled to an inverting node of an output buffer configured as a difference amplifier, while a non-inverting node of the difference amplifier is coupled to a fixed reference potential. As a result, the difference amplifier buffers the output of the switched DAC circuit while permitting the use of N-type input stages in the amplifier, which can enhance the bandwidth capability of the circuit.

4 Claims, 2 Drawing Sheets

DIFFERENCE AMPLIFIER FOR DIGITAL-TO-ANALOG CONVERTER

FIELD OF INVENTION

The present invention relates to data conversion, and more particularly to digital-to-analog converters for high-speed data transmissions.

BACKGROUND OF THE INVENTION

Conventional digital-to-analog converters ("DACs") are typically provided with an output amplifier for buffering the DAC output. Output amplifiers are often configured as unity gain buffers, which transmit information in response to changes in potential (e.g., voltage, electromotive force) applied to their non-inverting node. A common limitation in such output buffer configurations is the bandwidth capability (e.g., the rate at which a DAC may switch from one code to another) of the output amplifier. In addition to bandwidth limitations, these output buffer configurations are also prone to non-linearities that arise from common-mode voltage changes seen by the amplifier input stage such as changes in potential applied to the non-inverting node of the output amplifier.

Prior attempts to avoid these problems have focused on reducing the sensitivity of the input stage to changes in the common-mode voltage. For circuits configured to operate using only a single supply, however, this approach of reducing the sensitivity of the input stage necessitates that the input stage be configured to accommodate the shift in potential, varying from a positive reference potential to a ground potential, applied to the non-inverting node of the output amplifier. As a result, these output amplifiers have been required to employ P-type (e.g., PMOS, PNP) input stages. Unfortunately, however, such architectures are prone to problems, such as performance degradation and reduced speed relative to more desirable N-type (e.g., NPN, NMOS) input stages. Reduced speed, in turn, reduces the bandwidth capability of these DAC circuits.

For example, with reference to FIG. 1, a schematic diagram of a prior art DAC 100 is illustrated. DAC 100 includes a switched DAC circuit 104 and an output amplifier 108. DAC circuit 104 is configured in an R-2R ladder arrangement and comprises a plurality of sampling branches with DAC sampling switches 110. DAC switches 110 are configured to switch between a low reference source 112 and a high reference source 114. Output amplifier 108 comprises an operational amplifier configured as a voltage follower, with the output of amplifier 108 configured in a feedback arrangement with the inverting input terminal. An output 102 of switched DAC circuit 104 is coupled to a non-inverting input terminal 106 of output amplifier 108.

In response to the activation of one or more DAC switches 110, the potential of high reference source 114 is enabled to generate a code-dependent voltage 102, which is applied to the non-inverting terminal 106 of output buffer 108. It should be noted that the change in code dependent voltage 102 causes changes in current 116, which flows through switches 110 or any other sampling branch connected to code dependent voltage 102. DAC switches 110, which may be implemented as MOSFET semiconductors, may introduce non-linearities due to changes in current 116. While an ideal switch theoretically exhibits a constant low resistance independent of current, in reality, variations in current through the switches of a DAC may cause potential linearity errors in the output of the DAC. As a result, voltage 102 may not exhibit steady performance, but instead, may exhibit slight errors or non-linearities in response to switching from low reference source 112 to high reference source 114.

With reference to FIG. 2, a schematic diagram of another prior art circuit 200 is illustrated, wherein the gain of an output amplifier 208 may be modified by coupling resistors 224 and 284 to an output 202 and inverting node 220 of amplifier 208. It should be noted that if amplifiers 108, 208 depicted in the circuits of FIGS. 1 and 2 are to be operated using only a single positive supply (e.g., reference potential 114 is positive), and if low reference source 112 is at ground potential (e.g., the potential of the amplifier's non-inverting node must swing to ground), then the input stages of amplifiers 108, 208 will be required to be configured as PMOS input stages, thus realizing bandwidth limitations.

Accordingly, a need exists for improved DACs wherein the bandwidth and linearity can be increased.

SUMMARY OF THE INVENTION

The method and circuit of the present invention address many of the shortcomings of the prior art. In accordance with various aspects of the present invention, an improved method and circuit are provided that buffer the output of a DAC while improving the bandwidth and linearity of the circuit. In accordance with an exemplary embodiment of the present invention, an output of a switched DAC circuit is coupled to an inverting node of an output amplifier configured as a difference amplifier, with an output node of the output amplifier coupled through a feedback resistor to the inverting node, and a non-inverting node of the difference amplifier being coupled to a fixed reference potential. By fixing the potential applied to the non-inverting node of the output amplifier, the DAC circuit can avoid the design constraints necessary to accommodate potential variations. As a result, the output amplifier circuit may be simplified, reducing cost and complexity while improving reliability.

In accordance with another exemplary embodiment of the present invention, the output amplifier of the circuit can comprise an N-type device input stage, which has the effect of reducing output potential settling time and thereby improving bandwidth and accuracy.

In accordance with another exemplary embodiment of the present invention, the resistors of the output amplifier may be selectively configurable. For example, the selective configurability of the resistors may be accomplished through pin-pin configurability on the package such that the gain and offset ranges of the circuit may be suitably changed to desired parameters. In addition, the DAC circuit may be implemented with a package having pins configured to enable a user to configure resistors such that they may be tied in parallel, series, or allowed to float.

In accordance with another exemplary embodiment of the present invention, the switched DAC circuit can be configured as an R-2R ladder having a plurality of 2R legs, wherein the inherent resistive value of the switched DAC circuit is configured to provide one resistive component of an equivalent four resistor difference amplifier circuit.

DETAILED DESCRIPTION

Figure 1:
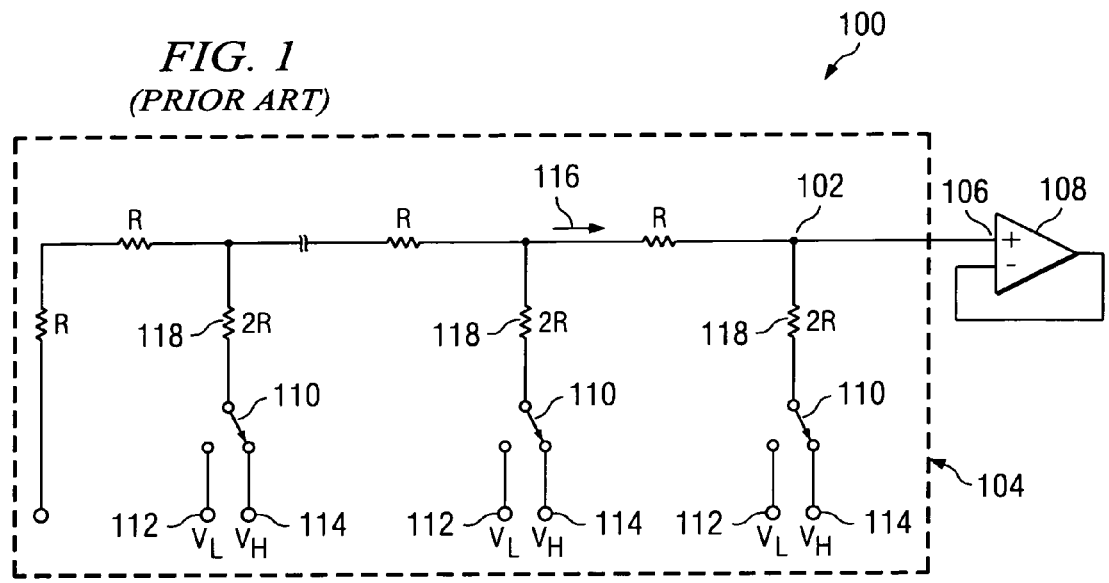
FIG. 1 illustrates a schematic diagram of a prior art buffered DAC.
Figure 2:
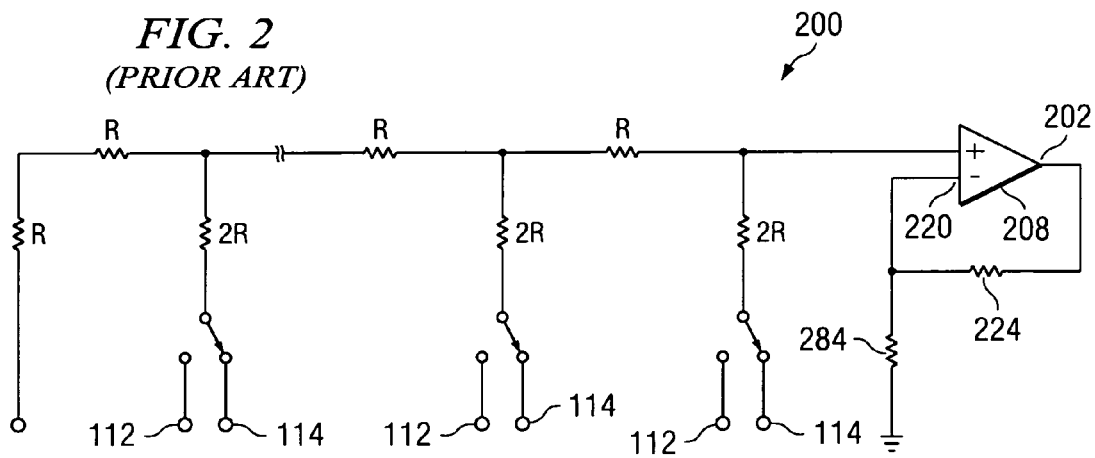
FIG. 2 illustrates a schematic diagram of another prior art buffered DAC.

The present invention may be described herein in terms of various functional components and/or various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application. However, for purposes of illustration only, exemplary embodiments of the present invention will be described herein in connection with R-2R ladder DACs and operational amplifiers. Further, it should be noted that while various components may be suitably coupled or connected to other components within exemplary circuits, such connections and couplings can be realized by direct connection between components, or by connection through other components and devices located therein between.

As discussed above, prior art buffered DACs have utilized either a unity gain output amplifier follower or a non-inverting output amplifier gain stage to buffer the output of the resistive R-2R ladder DAC. In each of these cases, the amplifiers have been configured to respond to changes in potential applied to the amplifier's non-inverting node. For single supply operation, these prior art buffers have required the input stage of the output amplifier to be designed to accommodate changes in potential, between the high reference potential and ground, applied to the amplifier's non-inverting node. This has required a folded cascode output amplifier input stage using either PMOS or PNP devices for the input differential pair. The required use of these P-type input differential pair devices imposes limitations on bandwidth capability relative to corresponding N-type devices. In addition, output amplifier buffers, as previously implemented, must be able to maintain low linearity error while responding to the potential changes applied to the non-inverting node. As a result, prior art configurations are prone to non-linearity errors and are not readily able to employ N-type devices, which aggravates their inherent limitations in bandwidth capability. Although attempts have been made to mitigate these limitations by reducing the sensitivity of the input stage to changes in potential applied to the non-inverting node, the requirement that the input stage be configured to operate with the change in potential, from the reference potential to ground, remains.

However, in accordance with various aspects of the present invention, an improved circuit is provided that buffers the output of a DAC while improving the bandwidth and linearity of the circuit. In accordance with an exemplary embodiment of the present invention, an output of a switched DAC circuit is coupled to an inverting node of an output amplifier configured as a difference amplifier, with an output node of the output amplifier coupled through a feedback resistor to the inverting node, and a non-inverting node of the difference amplifier being coupled to a fixed reference potential. By fixing the potential applied to the non-inverting node of the output amplifier, the DAC circuit can avoid the design constraints necessary to accommodate potential variations. As a result, the output amplifier circuit may be simplified, reducing cost and complexity while improving reliability.

Figure 3:
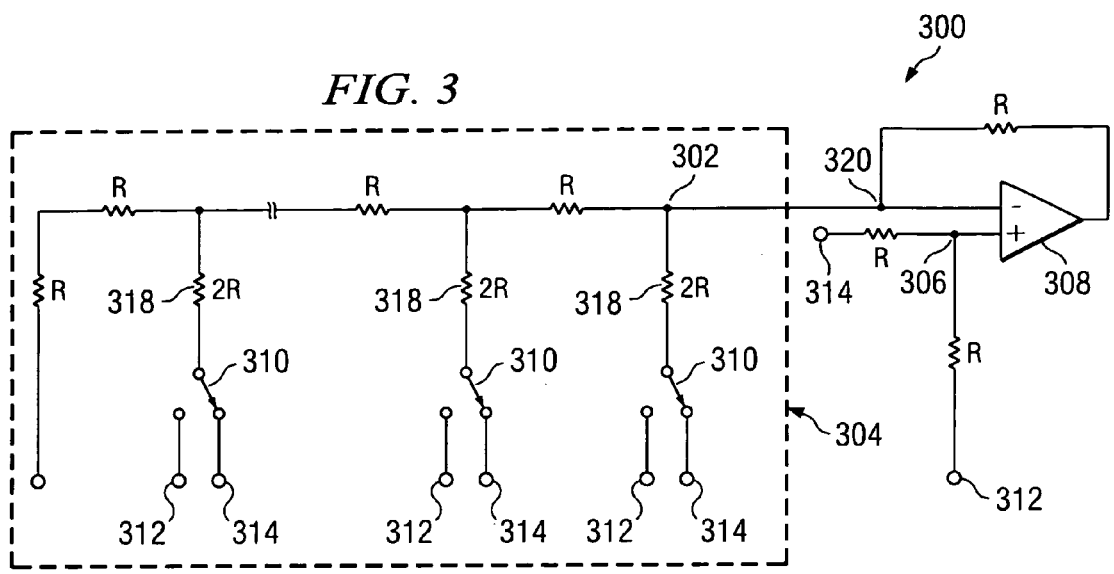
FIG. 3 illustrates a schematic diagram of a buffered DAC in accordance with an exemplary embodiment of the present invention.

For example, with reference to FIG. 3, in accordance with an exemplary embodiment of the present invention, a DAC 300 comprises a switched DAC circuit 304 and a difference amplifier 308. Switched DAC circuit 304 is configured in an R-2R ladder Arrangement and comprises a plurality of sampling branches 318 with DAC sampling switches 310. DAC switches 310 are configured to switch between a low reference source 112 and a high reference source 114. Switched DAC circuit 304 has an output 302 coupled to difference amplifier 308. While an R-2R ladder configuration is illustrated, switched DAC circuit 304 can comprise various configurations for switched DAC circuits now known or hereinafter devised, and can include any number of plurality of sampling branches.

Difference amplifier 308 is configured to buffer the output of switched DAC circuit 304. Difference amplifier 308 has an inverting node 320 coupled to output 302 of switched DAC circuit 304. In addition, an output of difference amplifier 308 is coupled in a feedback configuration through a resistor R to inverting node 320. Difference amplifier 308 has a non-inverting node 306 configured at a fixed potential. Moreover, the potential at non-inverting node 306 and inverting node 320 of difference amplifier 308 do not change with DAC code. Thus, difference amplifier 308 can be operated at a common mode voltage above or below ground potential for single supply operation.

In the exemplary embodiment, difference amplifier 308 has non-inverting node 306 configured at a fixed potential between that of a nigh reference source 314 and a low reference source 312 through a pair of resistors R. For example, with resistors R having substantially the same resistance value, non-inverting node 306 of difference amplifier 308 may be configured at a fixed potential substantially equal to the sum of one half of high reference source 314 and one half of low reference source 312. As a further example, in a DAC circuit configured for single supply operation, low reference source 312 can be ground (e.g., zero volts) such that the potential of non-inverting node 306 would be configured at approximately one-half of high reference source 314. However, resistors R can comprise various resistance values configured to provide a fixed potential to non-inverting node 306 comprising any other voltage potential between high reference source 314 and low reference source 312.

Difference amplifier 308 can comprise P-type devices, e.g., an P-MOS input stage, an PNP-type input stage, or the like. However, because difference amplifier 308 can be operated at a common mode voltage above or below ground potential for single supply operation, in accordance with another exemplary embodiment, difference amplifier 308 can also be configured with one or more N-type input stage devices for reducing output potential settling time and thereby improving bandwidth and accuracy. For example, difference amplifier 308 can comprise an N-MOS input stage, an NPN-type input stage, or other N-type configurations for reducing output potential settling time. The use of an N-type input stage can provide an improved settling time because N-type devices are vertical-type devices in which the bandwidth is typically at least an order of magnitude greater than that of comparable P-type devices, which are typically lateral-type devices. It should be noted that lateral-type devices not only exhibit much slower performances than vertical-type devices, but also exhibit DC degradation.

As a result, improved bandwidth and accuracy can be realized through an N-type difference amplifier 308.

Moreover, since non-inverting node 306 of difference amplifier 308 is at a fixed potential, output 302 of switched DAC circuit 304 is also at a fixed potential, preventing the occurrence of any code dependent current changes through any of switches 310. This fixed potential feature enhances the linearity of output 302 from DAC 300.

In accordance with another exemplary embodiment of the present invention, resistors R of difference amplifier 308 may be selectively configurable. For example, the selective configurability of resistors R may be accomplished through pin-pin configurability on the package such that the gain and offset ranges of DAC 300 may be suitably changed to desired parameters. In addition, DAC 300 may be implemented with a package having pins configured to enable the configurability of resistors R such that they may be tied in parallel, series, or allowed to float.

Figure 4A:
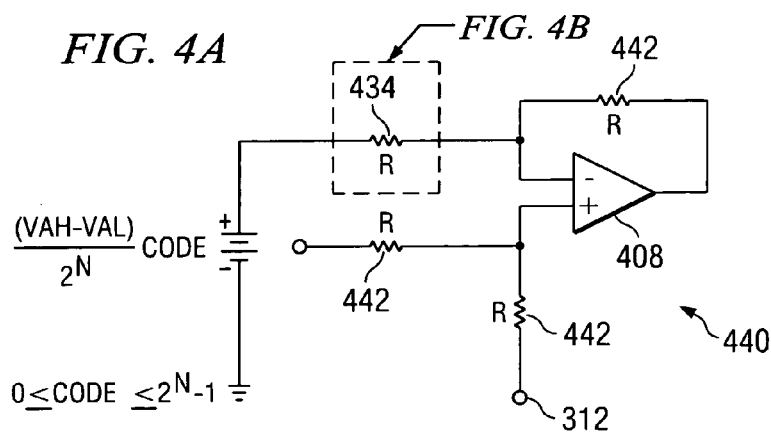
FIG. 4 illustrates a schematic diagram of a buffered DAC with an equivalent circuit in accordance with another exemplary embodiment of the present invention.
Figure 4B:
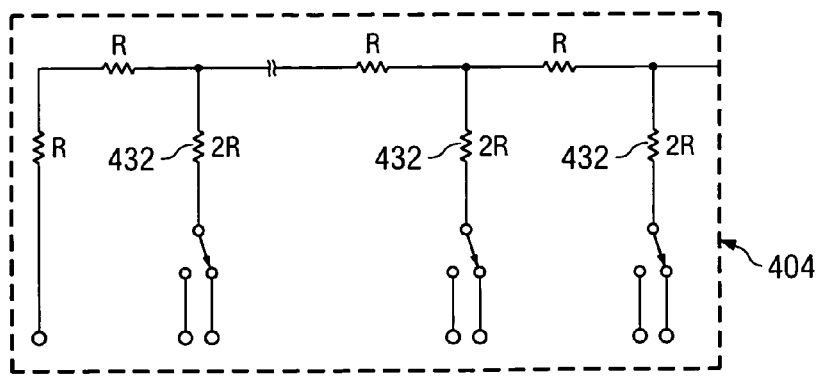

In accordance with yet another exemplary embodiment of the present invention, switched DAC circuit 304 can be configured as an R-2R DAC ladder having a plurality of 2R branches, wherein the inherent resistive value of switched DAC circuit 304 is configured to provide one resistive component of an equivalent four resistor difference amplifier circuit. For example, with reference to FIG. 4, an equivalent four resistor difference amplifier circuit 440 is illustrated in accordance with an exemplary embodiment of the present invention. In this exemplary embodiment, the inherent resistance of a switched DAC circuit 404, which comprises an R-2R DAC ladder having N branches, can provide one resistive component 434 of equivalent four resistor difference amplifier 440. Accordingly, the equivalent resistance of the plurality of resistors 432 (of R-2R ladder DAC 404) and resistors 442 may be configured to cause output amplifier 408 to function as a difference amplifier.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other DAC configurations or arrangements. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A digital-to-analog converter, comprising:
   (a) a difference amplifier with a non-inverting input, an inverting input, and an output;
   (b) a first resistor connected between said non-inverting input and a first reference potential;
   (c) a second resistor connected between said non-inverting input and a second reference potential;
   (d) a third resistor connected between said output and said inverting input; and
   (e) an R-2R resistor ladder network connected to said inverting input and with each 2R resistor having a switched connection to either said first or second reference potential, said switched connections set by an input digital word;
   (f) wherein said first resistor, said second resistor, and said third resistor all have resistance equal to R;
   (g) whereby a digital word used to set said switched connections is converted into an analog signal at said output.

2. The converter of claim 1, wherein said R-2R resistor ladder network has the form of N sections with each section a series resistor R plus a switched shunt resistor 2R where N is a positive integer together with a terminal resistor R connected to said first reference; whereby said R-2R resistor ladder network is equivalent to a resistor R connected between said inverting input and a third reference potential where said third reference potential is equal to the product of the difference of said second and first reference potentials multiplied by the quotient of the binary integer value of said digital word divided by $2^N$.

3. The converter of claim 1, wherein said first reference potential is ground.

4. A method of digital-to-analog conversion, comprising the steps of:
   (a) providing a difference amplifier with a non-inverting input, an inverting input, and an output;
   (b) providing a first resistor connected between said non-inverting input and a first reference potential;
   (c) providing a second resistor connected between said non-inverting input and a second reference potential;
   (d) providing a third resistor connected between said output and said inverting input;
   (e) providing an R-2R resistor ladder network connected to said inverting input and with each 2R resistor having a switched connection to either said first or second reference potential;
   (f) wherein said first resistor, said second resistor, and said third resistor all have resistance equal to R; and
   (g) using an input digital word to set said switched connections;
   (h) whereby said digital word is converted into an analog output.

* * * * *